(12) United States Patent
Itoh

(10) Patent No.: US 7,498,522 B2
(45) Date of Patent: Mar. 3, 2009

(54) MULTILAYER PRINTED CIRCUIT BOARD AND MANUFACTURING METHOD THEREOF

(75) Inventor: Nobutaka Itoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 134 days.

(21) Appl. No.: 11/507,478

(22) Filed: Aug. 22, 2006

(65) Prior Publication Data

US 2007/0175657 A1 Aug. 2, 2007

(30) Foreign Application Priority Data

Jan. 30, 2006 (JP) ............................. 2006-021387

(51) Int. Cl.
 *H05K 1/03* (2006.01)
(52) U.S. Cl. ........................................ 174/255; 174/260
(58) Field of Classification Search ............. 174/250, 174/255, 260
See application file for complete search history.

(56) References Cited

U.S. PATENT DOCUMENTS

| 5,773,764 | A * | 6/1998 | von Vajna | 174/250 |
| 7,199,462 | B2 * | 4/2007 | Jang et al. | 257/700 |
| 7,321,099 | B2 * | 1/2008 | Mishiro | 174/260 |
| 2003/0168249 | A1 * | 9/2003 | Ito et al. | 174/255 |

FOREIGN PATENT DOCUMENTS

| JP | 08-274418 | 10/1996 |
| JP | 09-172104 | 6/1997 |
| JP | 2001-185576 | 7/2001 |
| JP | 2002-290031 | 10/2002 |
| JP | 2002-324952 | 11/2002 |
| JP | 2003-152289 | 5/2003 |
| JP | 2003-258158 | 9/2003 |

* cited by examiner

*Primary Examiner*—Ishwarbhai B. Patel
(74) *Attorney, Agent, or Firm*—Staas & Halsey LLP

(57) ABSTRACT

A printed circuit board includes a product portion and a backing plate. Upper and lower surfaces of the backing plate are coated with solder masks with different material characteristics.

3 Claims, 8 Drawing Sheets

FIG.5

| MATERIAL NAME | YOUNG'S MODULUS (MPa) | POISSON RATIO | TEMPERATURE | LINEAR COEFFICIENT OF EXPANSION (1/°C) |
|---|---|---|---|---|
| SR-A | 2746 | 0.3 | | 5.50E-05 |
| SR-B | 2580 | 0.3 | 23 | 4.47E-05 |
| | 2260 | 0.3 | 100 | 4.90E-05 |
| | 1980 | 0.3 | 150 | 6.22E-05 |
| | 1260 | 0.3 | 200 | 8.36E-05 |
| SR-C | 4000 | 0.3 | 0 | 4.55E-05 |
| | 3000 | 0.3 | 50 | 1.20E-04 |
| | 2000 | 0.3 | 75 | |
| | 500 | 0.3 | 100 | |
| | 100 | 0.3 | 120 | |
| ⋮ | ⋮ | ⋮ | ⋮ | ⋮ |

MULTILAYER PRINTED CIRCUIT BOARD AND MANUFACTURING METHOD THEREOF

BACKGROUND OF THE INVENTION

1. Field of the Invention

The present invention relates to a multilayer printed circuit board, and a manufacturing method thereof.

2. Description of the Related Art

It has been common that, a printed circuit board has a multilayer (blind via hole (BVH)) structure including build-up layers to be mounted with electronic components such as semiconductor components etc. The multilayer printed circuit board includes multiple product portions linked with a portion that is to be removed in manufacturing process by joints. A plurality of semiconductor components can be intensively mounted on the product portions, which enhances mounting efficiency of the electronic components.

An outline structure of a conventional multilayer printed circuit board 10 is explained with reference to FIGS. 8 and 9. FIG. 8 is a plan view of the multilayer printed circuit board 10, and FIG. 9 is a cross section of the multilayer printed circuit board 10.

The printed circuit board 10 includes product portions 11 with electronic components etc. mounted thereon, a backing plate 12 that is to be removed in manufacturing process, joints 13 on perforations, and slits 14. The product portions 11 are linked to the backing plate 12 by the joints 13.

Further, the printed circuit board 10 includes an insulating material 10a, conductive patterns 15 on the front and back surfaces of the insulating material 10a, and internal conductive patterns 16 inside the printed circuit board 10. The conductive patterns 15 and the internal conductive patterns 16 are linked by a plurality of vias 17. Thus, the printed circuit board 10 has a multilayer structure in which a plurality of patterns are electrically connected to each other. Solder mask 18 is applied to the upper and lower surfaces of the product portion 11.

The solder mask 18 prevents electrical coupling of electrical circuit patterns of the adjacent conductive patterns 15. As shown in FIG. 9, in the printed circuit board 10, a solder ball of the electronic components is coupled with a solder ball on the conductive pattern 15 such that the electronic components are mounted on the printed circuit board 10. After the electronic components are heat-bonded to the printed circuit board 10 by reflow soldering, the joints 13 (shown in FIG. 8) are cut to separate the product portions 11, and the printed circuit board 10 is embedded in an electronic device.

Sometimes warpage occurs in the printed circuit board 10 after the reflow process due to the heat of the reflow process. Some conventional technologies have been proposed to overcome this warpage problem of the printed circuit board.

Japanese Patent Laid-Open Publication No. 2003-258158 discloses a manufacturing method of a semiconductor device. In the conventional method, multiple bracket holes or grooves are formed in longitudinal and lateral directions along a peripheral area of a printed circuit board to suppress warping of a multi-wire board such as a Large Scale Integrated Package (LSI-PKG).

Japanese Patent Laid-Open Publication No. H8-274418 discloses a structure of the printed circuit board, in which a tapered hole is formed on a splitting line of a board, the tapered hole is filled with reinforcing material of resin, and, after mounting of components, the reinforcing material is removed by heat. In the disclosed printed circuit board, splitting can be easily carried out at the splitting line of the board, which suppresses warping during mounting of the components.

Japanese Patent Laid-Open Publication No. 2002-290031 discloses a circuit board and a manufacturing method thereof, in which warping is suppressed by applying solder masks in different thicknesses to the front and back surfaces of a printed circuit board, and coupling two boards via a spacer for reinforcement.

Japanese Patent Laid-Open Publication No. H9-172104 discloses a board for a semiconductor device, in which areas to be coated with solder masks are set on the front and back surfaces of the board at a predetermined ratio, and also the solder masks are applied in thicknesses at a predetermined ratio to suppress warping of the board.

Japanese Patent Laid-Open Publication No. 2003-152289 discloses a printed circuit board and a multilayer printed circuit board, in which a board is reinforced by embedding a metal plate in a backing plate of the board to prevent occurrence of warping during the reflow process.

Japanese Patent Laid-Open Publication No. 2001-185576 discloses a semiconductor device, in which dummy wiring is formed on a board to prevent warping of the board.

Japanese Patent Laid-Open Publication No. 2002-324952 discloses a printed circuit board, in which the entire surface of a backing plate of the printed circuit board is covered with copper foils, and the copper foils are coupled by vias to enhance the rigidity of the backing plate and suppress warping of the board.

However, in the conventional technologies, warping and deformation of a printed circuit board still occurs due to heat of curing (thermosetting) in the reflow process. To be specific, as shown in FIG. 10, because the same material is used for solder masks that are respectively applied to both the surfaces of the printed circuit board, warping directions of the solder masks during the reflow process are nearly the same. Accordingly, the printed circuit board (the product portions 11) is also bent with warping of the solder mask.

If the printed circuit board warps, it is difficult to solder the electronic components to the product portions, and the electronic components are not securely bonded to the product portions. This results in reduction in yield, quality, and reliability in manufacturing the printed circuit board is reduced.

SUMMARY OF THE INVENTION

It is an object of the present invention to at least partially solve the problems in the conventional technology.

According to an aspect of the present invention, a multilayer printed circuit board that includes a conductive circuit pattern and an electronic component, includes a backing plate with a first surface and a second surface, which is to be removed-away during manufacturing process of the multilayer printed circuit board, and a product portion for mounting the electronic component and at least partially surrounded by the backing plate. At least one of the first surface and the second surface of the backing plate is coated with a solder mask.

According to another aspect of the present invention, a multilayer printed circuit board that includes conductive circuit patterns and an electronic component, includes a backing plate with a first surface and a second surface, which is to be removed-away during manufacturing process of the multilayer printed circuit board, a product portion for mounting the electronic component and at least partially surrounded by the backing plate, and a reinforcing member that is arranged in a portion where less number of the conductive circuit patterns are present.

According to still another aspect of the present invention, a manufacturing method of a multilayer printed circuit board that includes a product portion and a backing plate, includes forming a circuit pattern on the product portion, mounting an electronic component on the product portion, and applying solder masks with different material characteristics to a first surface and a second surface of the backing plate.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 5 is an example of the contents of a material characteristics table;

DETAILED DESCRIPTION OF THE PREFERRED EMBODIMENTS

Exemplary embodiments of the present invention are explained in detail below with reference to the accompanying drawings. It should be noted that the present invention is not to be limited to the following embodiments.

Figure 1:
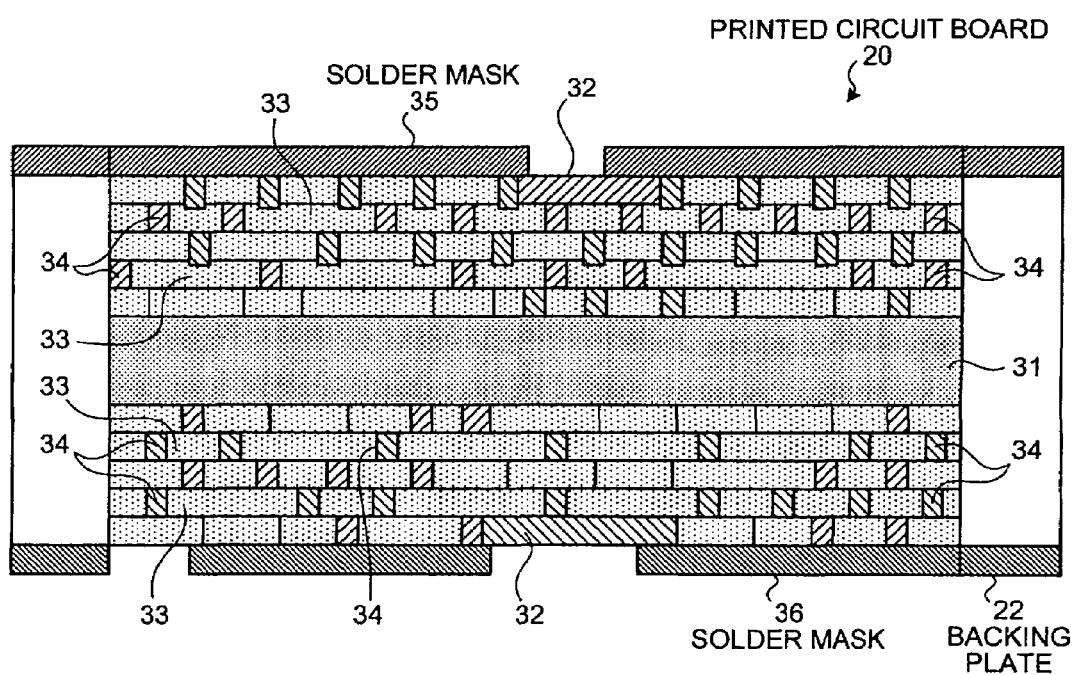
FIG. 1 is a cross section of a multilayer printed circuit board according to a first embodiment of the present invention.
Figure 2:
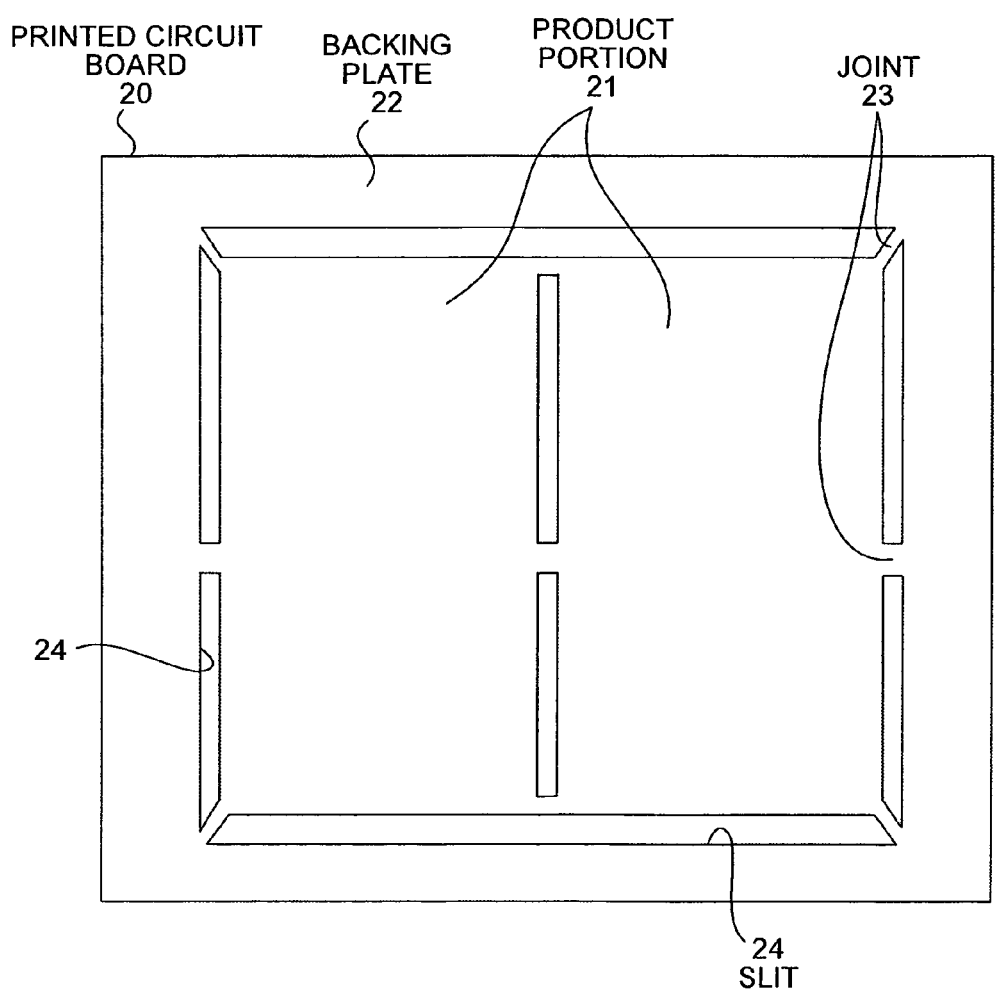
FIG. 2 is a plan view of the multilayer printed circuit board shown in FIG. 1.

The outline of a structure of a multilayer printed circuit board 20 according to a first embodiment of the present invention is explained with reference to FIGS. 1 and 2. FIG. 1 is a cross section of the multilayer printed circuit board 20, and FIG. 2 is a plan view of the multilayer printed circuit board 20.

The printed circuit board 20 includes product portions 21 with electronic components etc. mounted thereon, a backing plate 22 that is to be removed in manufacturing process, joints 23 formed on perforations, and slits 24. The product portions 21 are linked to the backing plate 22 by the joints 23. The upper and lower surfaces of the backing plate 22 are coated with solder mask 35 and solder mask 36 having different material characteristics, respectively. After the electronic components are soldered by the reflow process (heat fusing) onto a board, a predetermined number (two in the example of FIG. 2) of printed circuit boards can be obtained by a splitting process.

Further, as shown in FIG. 1, the printed circuit board 20 includes a core 31 in the center as an insulating material that is reinforced by epoxy resin and glass cloth, a plurality of pads 32, and build-up layers 33 between the pads 32. The pads 32 are connected by vias 34. Thus, the printed circuit board 20 has a multilayer structure in which a plurality of wiring patterns are electrically connected to each other.

The solder mask 35 is applied to the upper surface of the backing plate 22 (in the proximity of the pad 32), and the solder mask 36 is applied to the lower surface of the backing plate 22. Solder masks having different material characteristics (materials each having different linear expansion coefficient, Young's modulus, or Poisson's ratio) are selected as the solder mask 35 and the solder mask 36.

An appropriate solder mask is selected by using a solder mask material characteristics table T (shown in FIG. 5) that stores material characteristics (linear expansion coefficient, Young's modulus, and Poisson's ratio) of materials for the solder masks.

To be specific, because the solder mask 35 and the solder mask 36 having different material characteristics are selected and applied respectively to the upper and lower surfaces of the backing plate 22, the backing plate 22 is bent in a direction that counters warping of the product portions 21. This suppresses overall warping of the product portions 21, and thereby suppresses overall warping of the printed circuit board 20. Thus, high precision mounting of the electronic components can be attained.

According to the first embodiment, the solder mask 35 and the solder mask 36 having different material characteristics are used. However, the solder mask 35 and the solder mask 36 can be applied in different thicknesses instead, respectively, to the upper and lower surfaces of the backing plate 22 such that the thickness of one is greater than that of the other.

Further, according to the first embodiment, solder masks are applied to both the surfaces of the backing plate 22; however, the solder masks need not be applied to both the front and back surfaces of the backing plate 22. In other words, a solder mask can be applied to only one of the surfaces of the backing plate 22. In addition, the product portion can be coated with a solder mask with material characteristics different from material characteristics of solder masks that are applied to the front and back surfaces of the backing plate 22.

FIG. 5 is an example of the contents of the solder mask material characteristics table T. The solder mask material characteristics table T illustrates material characteristics (Young's modulus, Poisson's ratio, and linear expansion coefficient) correspondingly to names (SR-A, SR-B, SR-C, etc.) of materials that are used as solder masks. An analysis of the material characteristics allows an appropriate solder mask to be selected. Young's modulus indicates the stiffness of the material. Poisson's ratio indicates the degree of deformation of the material in the lateral and longitudinal directions upon application of load, such as tension, on the material. Linear expansion coefficient indicates an expansion ratio at a temperature rise of one degree.

To be specific, materials having different material characteristics, i.e., different Young's modulus, Poisson's ratio, or linear expansion coefficient, are selected for the solder mask 35 and the solder mask 36. Referring to the solder mask material characteristics table T, for example, when a solder mask material (SR-A) that warps upward is selected as the solder mask 35, while a solder mask material (SR-C with Young's modulus 2000) that warps downward is selected as the solder mask 36, the solder mask 35 and the solder mask 36 warp in opposite directions. Thus, warpings of the solder mask 35 and the solder mask 36 against the printed circuit board 20 offset each other during the reflow process. Therefore, the printed circuit board 20 can be manufactured with less warping.

Figure 3:
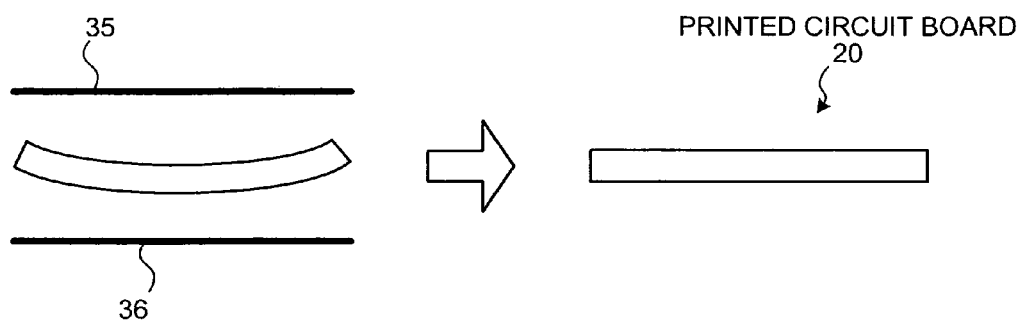
FIG. 3 is a schematic for explaining warping of solder masks shown in FIG. 1.

FIG. 3 is a schematic for explaining warping directions of the solder mask 35 and the solder mask 36, and the state of the printed circuit board 20. Linear expansion coefficient of the solder mask 36 on the lower surface is greater than that of the solder mask 35 on the upper surface of the printed circuit board 20. The effect of the solder mask 35 and the solder mask 36 having different linear expansion coefficients enables the manufacture of the printed circuit board 20 where warping is negligible. To be specific, because linear expansion coefficient of the material selected for the solder mask 35 on the upper surface is less than that of the solder mask 36 on the lower surface, the solder mask 36 expands larger by a rise in temperature during the reflow process. Consequently, warping of the board can be suppressed.

Figure 4:
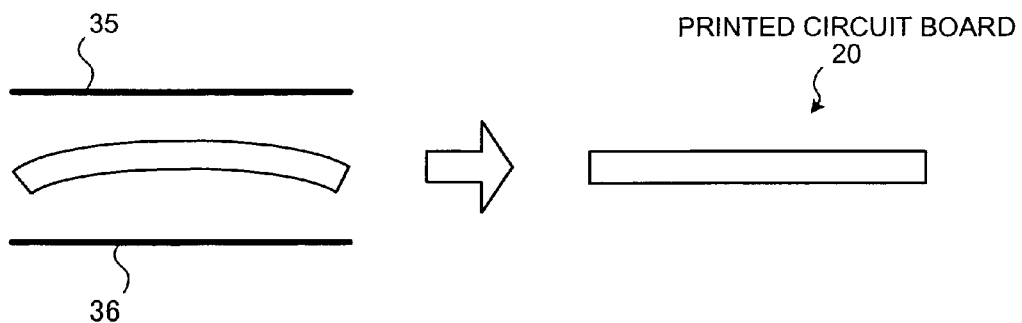
FIG. 4 is another schematic for explaining warping of the solder masks.

On the other hand, in FIG. 4, linear expansion coefficient of the solder mask 35 on the upper surface is greater than that of the solder mask 36 on the lower surface. As in FIG. 3, the effect of the solder mask 35 and the solder mask 36 having different linear expansion coefficients enables the manufacture of the printed circuit board 20 where warping is negligible.

In the printed circuit board 20 according to the first embodiment, the solder mask 35 and the solder mask 36 having different material characteristics are applied respectively to the upper and lower surfaces of the backing plate 22 that is linked to the product portions 21 by the joints 23. Even if warping occurs in the printed circuit board 20, the backing plate 22 warps in a direction that counters warping of the product portions 21 due to the effect of the solder mask 35 and the solder mask 36 having different linear expansion coefficients. Consequently, it is possible to suppress overall warping of the product portions 21. Thus, a printed circuit board can be realized in which warping that is detrimental to mounting the electronic components is suppressed.

Figure 6:
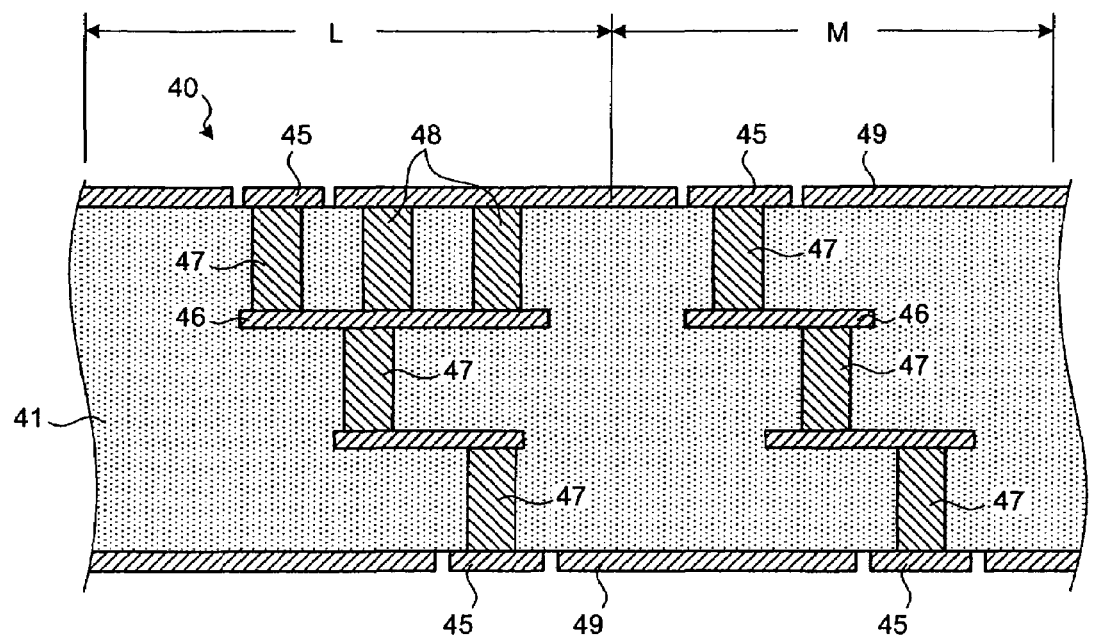
FIG. 6 is a cross section of a multilayer printed circuit board according to a second embodiment of the present invention.
Figure 7:
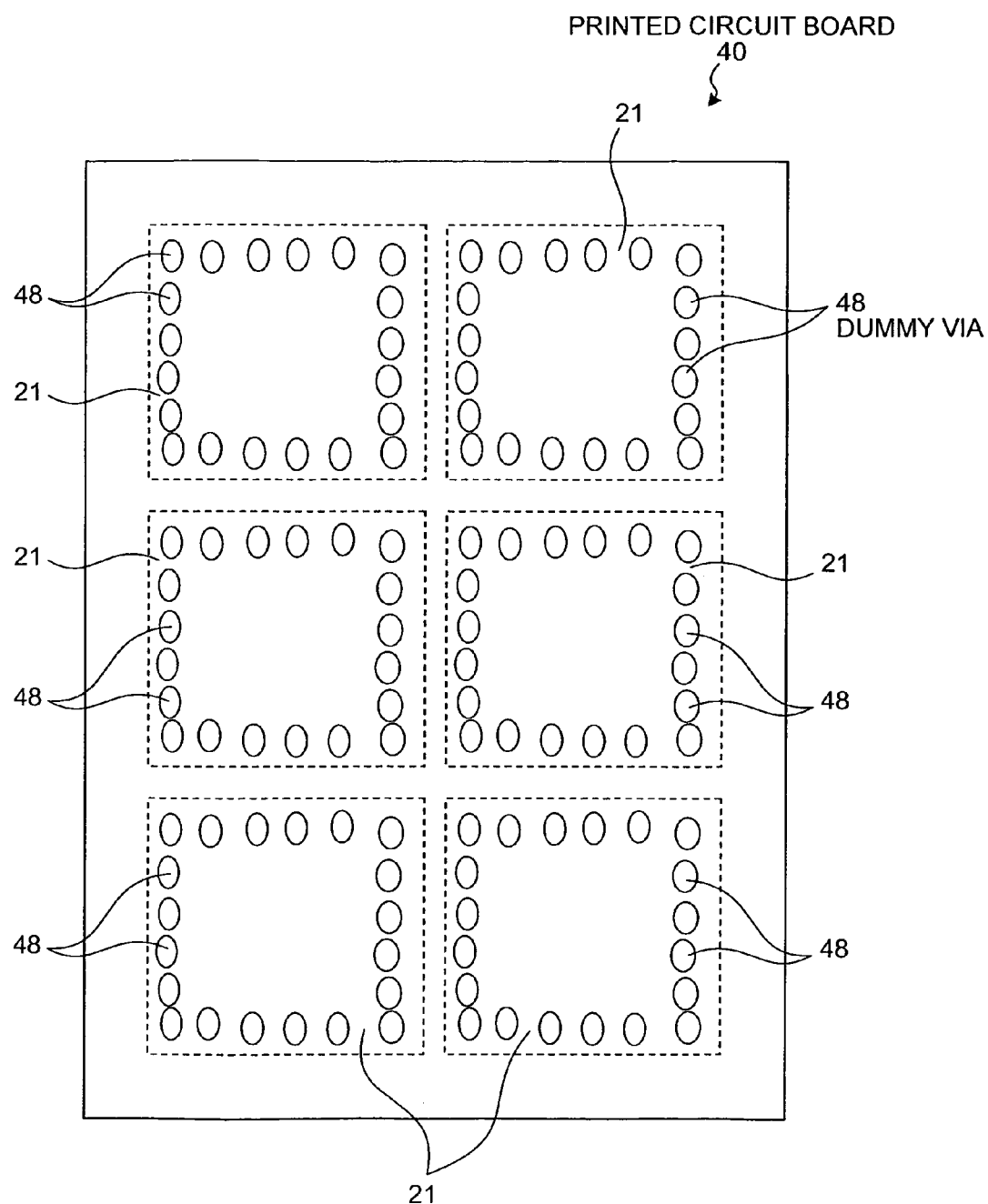
FIG. 7 is a plan view of the multilayer printed circuit board shown in FIG. 6.
Figure 8:
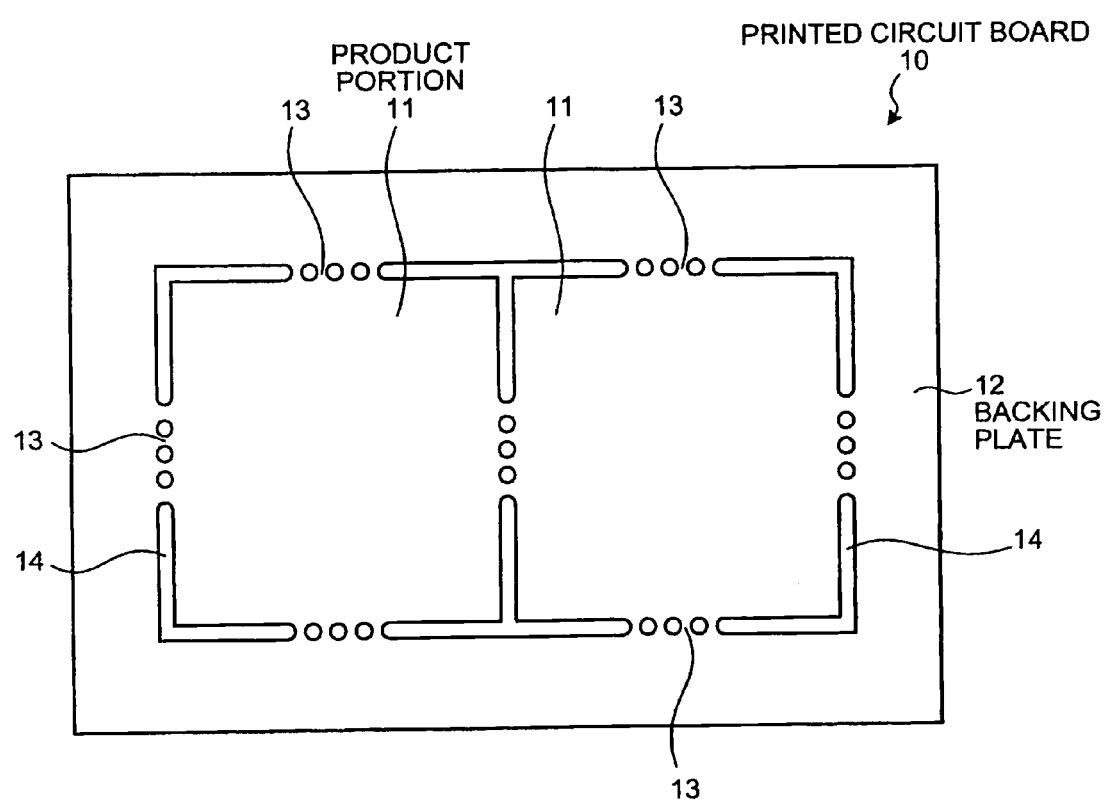
FIG. 8 is a plan view of a conventional printed circuit board.
Figure 9:
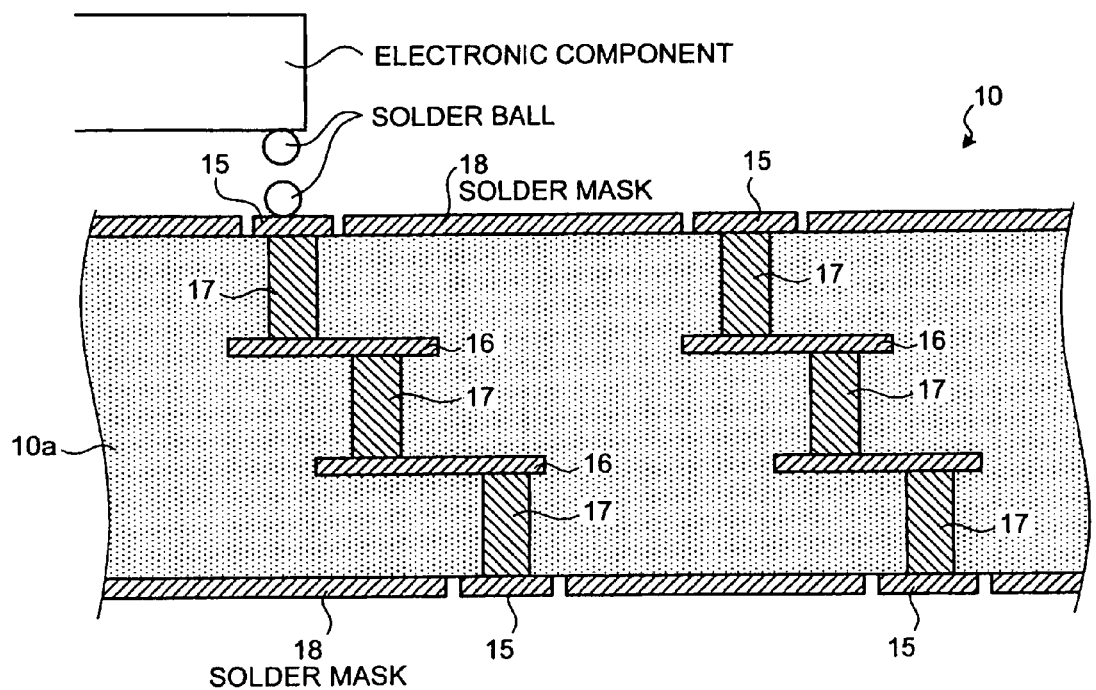
FIG. 9 is a cross section of the conventional printed circuit board.
Figure 10:
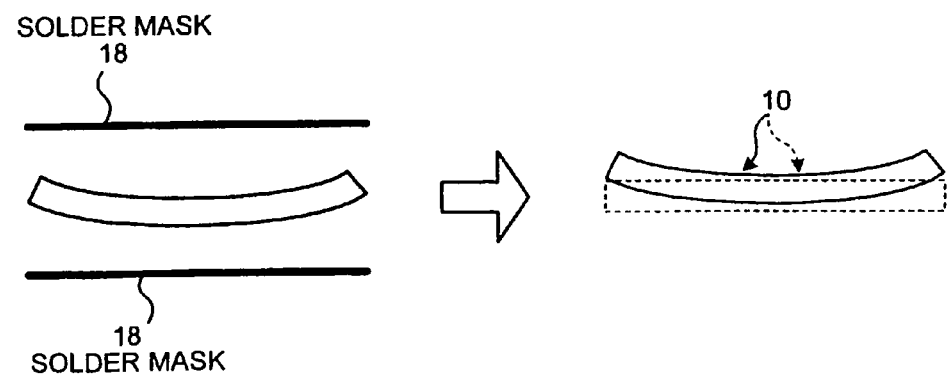
FIG. 10 is a schematic for explaining warping of a conventional solder mask.

A multilayer printed circuit board according to a second embodiment is explained next. FIG. 6 is a cross section of the multilayer printed circuit board, and FIG. 7 is a plan view of the multilayer printed circuit board.

In the printed circuit board 20 according to the first embodiment, the solder mask 35 and the solder mask 36 having different material characteristics are applied respectively to the upper and lower surfaces of the backing plate 22 that is linked to the product portions 21 by the joints 23. Thus, warping of the product portions 21 is suppressed. According to the second embodiment, however, based on the layout or wiring density of conductive circuit patterns, dummy vias (reinforcing members) are arranged in portions having less dense conductive circuit patterns. As a result, a uniform wiring density of the conductive circuit patterns is achieved, which enhances rigidity and suppresses warping.

In other words, a printed circuit board includes, due to circuitry, a portion where conductive circuit patterns are dense and a portion (less dense portion) where conductive circuit patterns hardly exist. To be specific, in circuitry where a Large Scale Integrated (LSI) circuit or the like is mounted on the printed circuit board, conductive circuit patters in the proximity of the LSI are complicated, and other conductive circuit patters are rough.

In the second embodiment, by focusing on the aforementioned aspect, dummy vias are arranged in an appropriate portion of the product portion 21 to enhance the rigidity of the portion with less dense conductive circuit patterns and prevent warping.

As shown in FIG. 6, a printed circuit board 40 includes an insulating material 41 that is reinforced by epoxy resin and glass cloth, conductive patterns 45 at predetermined positions on the front and back surfaces of the insulating material 41, and internal conductive patterns 46 inside the printed circuit board 40. The conductive patterns 45 and the internal conductive patterns 46 are linked by vias 47. Thus, the printed circuit board 40 has a multilayer structure in which a plurality of patterns are electrically connected to each other. Solder mask 49 is applied in the proximity of the conductive patterns 45.

In FIG. 6, an area L indicates a portion having less dense conductive circuit patterns, and an area M indicates a portion having dense conductive circuit patterns. Dummy vias 48 are arranged in the proximity of the via 47 in the area L. That is, the dummy vias 48 physically reinforces the portion having less dense conductive circuit patterns, thereby ensuring a uniform wiring density of the conductive circuit patterns and enhancing rigidity. Thus, it is possible to prevent warping that is detrimental to mounting the electronic components on the board.

In the second embodiment, the dummy vias 48 are arranged in the proximity of the via 47 in the area L. When the dummy vias 48 are actually arranged, the wiring density of the conductive circuit patterns and positions of the electronic components to be mounted are estimated. Based on the estimated data, the printed circuit board is designed in consideration of the positions and number of the dummy vias 48.

FIG. 7 depicts an example of the dummy vias 48 arranged at the periphery of the product portion 21. In this manner, when the multiple dummy vias 48 are arranged at the periphery of the product portion 21, warping of the product portion 21 can be effectively suppressed.

Although material characteristics of the dummy vias 48 are not considered in the structure of the printed circuit board 40 according to the second embodiment, a material with material characteristics appropriate for reinforcement can be selected for the dummy vias 48 according to the wiring density of the conductive circuit patterns and size of the electronic components to be mounted.

As describe above, in the printed circuit board 40 according to the second embodiment, the dummy vias 48 are arranged in a portion having less number of the conductive circuit patterns to reinforce the rigidity of the portion. Thus, the printed circuit board can be realized in which warping that is detrimental to mounting the electronic components is suppressed.

According to the first and second embodiments, when the printed circuit board is actually manufactured, appropriate materials are selected for the solder masks referring to the solder mask material characteristics table T (shown in FIG. 5). In addition, warping amount to be improved is analyzed for the entire printed circuit board and also for each component mounting area from a difference between the allowable warping amount and estimated warping amount of the solder masks. Based on the analysis, the dummy vias 48 (shown in FIG. 6) for correcting warping of the entire printed circuit board and each component mounting area are arranged. If the arrangement of the dummy vias 48 alone is unable to suppress warping, recommended values of material characteristics of the dummy vias 48 are also analyzed, and the printed circuit board is designed by selecting appropriate material for the dummy vias 48. To be specific, a database is created that stores assignable position coordinates of the dummy vias 48. Also, materials of the solder masks and positioning areas of the dummy vias 48 are analyzed in detail by using, for example, a database to check the allowable warping amount of the printed circuit board and a warping direction determining device that determines the warping direction of the printed circuit board.

As set forth hereinabove, according to an embodiment of the present invention, a printed circuit board includes a backing plate having front and back surfaces coated with solder masks with different material characteristics. Instead of using materials with different characteristics, the solder masks can be applied in different thicknesses respectively to the front and back surfaces of the backing plate. Additionally, a solder mask can be applied to only one of the surfaces of the backing plate to suppress warping and deformation of the printed circuit board. Thus, it is possible to realize high precision mounting of electronic components.

Moreover, deformation of the printed circuit board caused by warping due to heat in the reflow process can be prevented, resulting in enhancement of yields, quality, and reliability in manufacturing the printed circuit board. Besides, the electronic components can be densely mounted on the printed circuit board, which secures long-term reliability after mounting of the electronic components.

Furthermore, the solder masks applied respectively to the front and back surfaces of the backing plate have material characteristics different from those of a solder mask applied to a product portion. Consequently, warping and deformation of the printed circuit board can be prevented by the material characteristics opposite to each other. Thus, the electronic components can be reliably mounted.

Moreover, a reinforcing member is arranged in a portion having less number of conductive circuit patterns to reinforce the portion. The reinforcing member enhances the rigidity of the periphery of the product portion, which suppresses warping of the printed circuit board.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A multilayer printed circuit board that includes a conductive circuit pattern and an electronic component, the multilayer printed circuit board comprising:
    a backing plate that includes a first surface and a second surface and that is to be removed-away during a manufacturing process of the multilayer printed circuit board, the first surface of the backing plate being coated with a first solder mask, and the second surface of the backing plate being coated with a second solder mask with a material characteristic different from that of the first solder mask; and
    a product portion for mounting the electronic component and at least partially surrounded by the backing plate, the product portion being coated with a third solder mask with a material characteristic different from that of the first solder mask and the second solder mask.

2. The multilayer printed circuit board according to claims 1, wherein the material characteristic includes linear expansion coefficient.

3. The multilayer printed circuit board according to claim 1, wherein the material characteristic includes Young's modulus.

* * * * *

UNITED STATES PATENT AND TRADEMARK OFFICE
CERTIFICATE OF CORRECTION

| | |
|---|---|
| PATENT NO. | : 7,498,522 B2 |
| APPLICATION NO. | : 11/507478 |
| DATED | : March 3, 2009 |
| INVENTOR(S) | : Nobutaka Itoh |

It is certified that error appears in the above-identified patent and that said Letters Patent is hereby corrected as shown below:

Column 8, Line 26, change "claims" to --claim--.

Signed and Sealed this

Nineteenth Day of May, 2009

JOHN DOLL
*Acting Director of the United States Patent and Trademark Office*